United States Patent [19]
Parker et al.

[11] Patent Number: 5,146,388
[45] Date of Patent: Sep. 8, 1992

[54] VARIABLE POWER DRIVE CIRCUIT

[75] Inventors: Edward I. Parker, Holden; Vincent A. Piucci, Jr., Spencer; Harold Weiss, Marlborough, all of Mass.

[73] Assignee: The Stanley Works, New Britain, Conn.

[21] Appl. No.: 627,040

[22] Filed: Dec. 13, 1990

Related U.S. Application Data

[63] Continuation-in-part of Ser. No. 451,862, Dec. 18, 1989, abandoned.

[51] Int. Cl.$^5$ .............................................. H01H 47/00
[52] U.S. Cl. ...................................... 361/153; 361/185; 307/247.1; 307/268; 307/542.1
[58] Field of Search .................... 323/322, 323; 307/247.1, 261, 268, 273, 643, 647, 648; 361/3, 152, 153, 154, 160, 170, 185, 205; 219/10.55 B

[56] References Cited

U.S. PATENT DOCUMENTS

| | | | |
|---|---|---|---|
| 4,041,267 | 8/1977 | Wechler | 219/10.55 B |
| 4,153,922 | 5/1979 | Azuma et al. | 361/3 |
| 4,333,019 | 6/1982 | Weigart | 307/643 |
| 4,360,855 | 11/1982 | Ohba | 361/153 |
| 4,490,771 | 12/1984 | Huber et al. | 361/154 |
| 4,492,880 | 1/1985 | Weiss | 307/643 |
| 4,543,493 | 7/1985 | Stanley et al. | 361/205 |
| 4,578,734 | 3/1986 | Delbosse | 361/153 |
| 4,631,627 | 12/1986 | Morgan | 361/153 |
| 4,713,564 | 12/1987 | Kimball et al. | 307/247.1 |

*Primary Examiner*—Jeffrey A. Gaffin
*Attorney, Agent, or Firm*—Samuels, Gauthier & Stevens

[57] ABSTRACT

A driver circuit that is responsive to an input AC voltage provides a variable drive signal to a load circuit, such as, a solenoid coil, for each actuation of a switch where the variable drive signal duration is determined by the setting of a variable resistor. In one embodiment, a sine wave shaper produces a positive edge variably delayed square wave timing signal for a continuously clocked flip-flop. In response to the switch actuation, the clocked flip-flop generates a control signal for a selected period of time that is related to one cycle of the AC input voltage. In another embodiment, a one shot produces a positive edge variable delayed square wave timing signal in response to the switch, the signal then being received by another one shot which creates a control signal for a selected period of time that is related to one cycle of the AC input voltage. The selected period of time occurs only during the positive portion of the input AC voltage cycle. The control signal is employed to generate the drive signal for the load circuit.

16 Claims, 5 Drawing Sheets

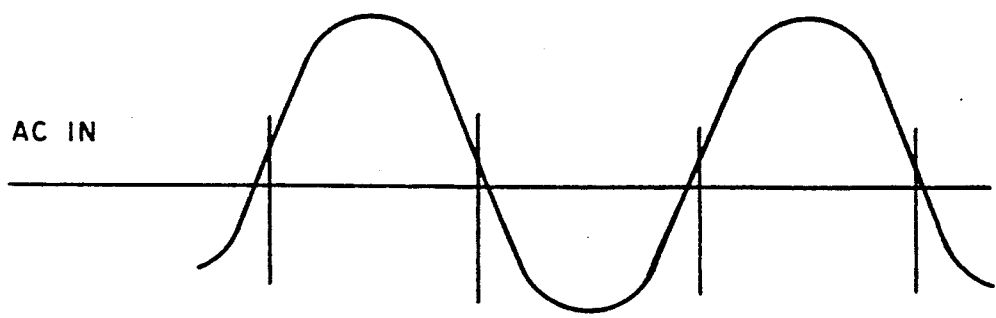
AC IN
FIG.4A
INPUT PIN 4
0V
FIG.4B
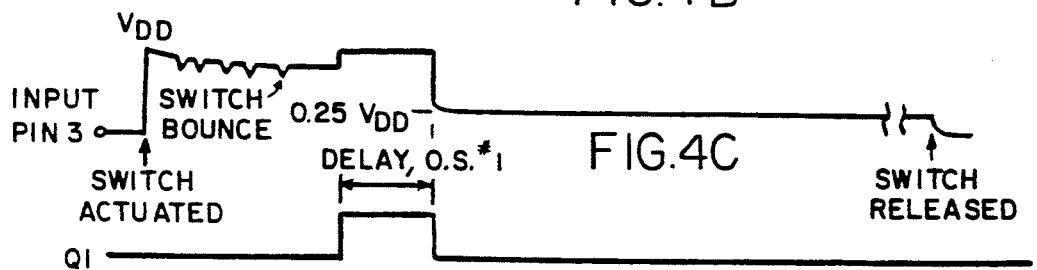
$V_{DD}$
INPUT PIN 3 — SWITCH BOUNCE  $0.25 V_{DD}$
SWITCH ACTUATED  DELAY, O.S.#1   FIG.4C   SWITCH RELEASED
Q1
FIG.4D
Q2   O.S.#2  $100 \mu sec$
FIG.4E
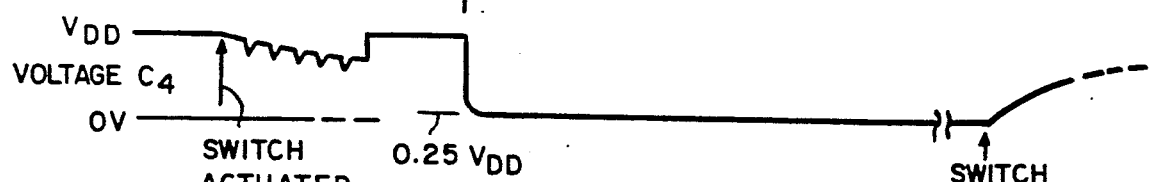
COIL VOLTAGE
FIG.4F
$V_{DD}$
VOLTAGE $C_4$
0V
SWITCH ACTUATED   $0.25 V_{DD}$   SWITCH RELEASED
FIG.4G

VARIABLE POWER DRIVE CIRCUIT

CROSS-REFERENCE TO RELATED APPLICATION

This application is a continuation-in-part application of U.S. Ser. No. 451,862 filed Dec. 18, 1989, now abandoned. The present application and application Ser. No. 451,862 are owned by a common assignee.

BACKGROUND OF THE INVENTION

The present invention drive circuits in general and, more particularly, to a drive circuit that is responsive to an input AC voltage for providing a variable switch actuated drive signal to a load circuit such as, a solenoid coil without the deleterious effect of switch contact bounce.

Various drive circuits for actuating electrically operated stapling devices have been disclosed in the art. For example, U.S. Pat. No. 4,333,019 and U.S. Pat. No. 4,492,880 disclose such circuits. Drive circuits for electric staplers and the like should provide a high degree of immunity from false actuations that can be produced by noise and other pulses in the AC line voltage. In addition, such drive circuits should prevent accidental firings that may result from switch bounce and other artifacts.

It is accordingly a general object of the present invention to provide an improved driver circuit.

It is a specific object of the invention to provide an improved driver circuit for use with an electric stapler.

It is a further object of the invention to provide a driver circuit that is responsive to an input AC voltage to generate a variable power drive signal for a load circuit, such as, a solenoid coil in response to the actuation of a switch.

It is another object of the invention to provide a variable power driver circuit that is independent of the frequency of the input AC voltage.

It is still another object of the invention to provide an easily adjustable variable power driver circuit for a solenoid coil.

SUMMARY OF THE INVENTION

The driver circuit of the present invention is responsive to an input AC voltage to provide a variable power drive signal to a load circuit, such as a solenoid coil, for each actuation of a switch, where the duration of the variable power drive signal is determined by the setting of a variable resistor. The input AC voltage sine wave is shaped to produce a positive edge variably delayed square wave timing signal. The timing signal is applied to a continuously clocked flip-flop, or a one shot, which generates a control signal for a selected period of time upon actuation. The control signal is related to one cycle of the AC input voltage. The selected period of time occurs only during the positive portion of the input AC voltage cycle. The control signal from the continuously clocked flip-flop, or one shot, is employed to actuate a firing circuit that supplies the actual drive signal to the load circuit.

BRIEF DESCRIPTION OF THE DRAWINGS

The above objects and other objects and features and advantages of the present invention will become apparent from a detailed description in the preferred embodiments of the invention, selected for purposes of illustration and shown in the accompanying drawings, in which:

FIGS. 4a, 4b, 4c, 4d, 4e, 4f and 4g are waveforms illustrating the principles used in the second embodiment.

DETAILED DESCRIPTION OF THE PREFERRED EMBODIMENTS

Embodiment 1

Figure 1:
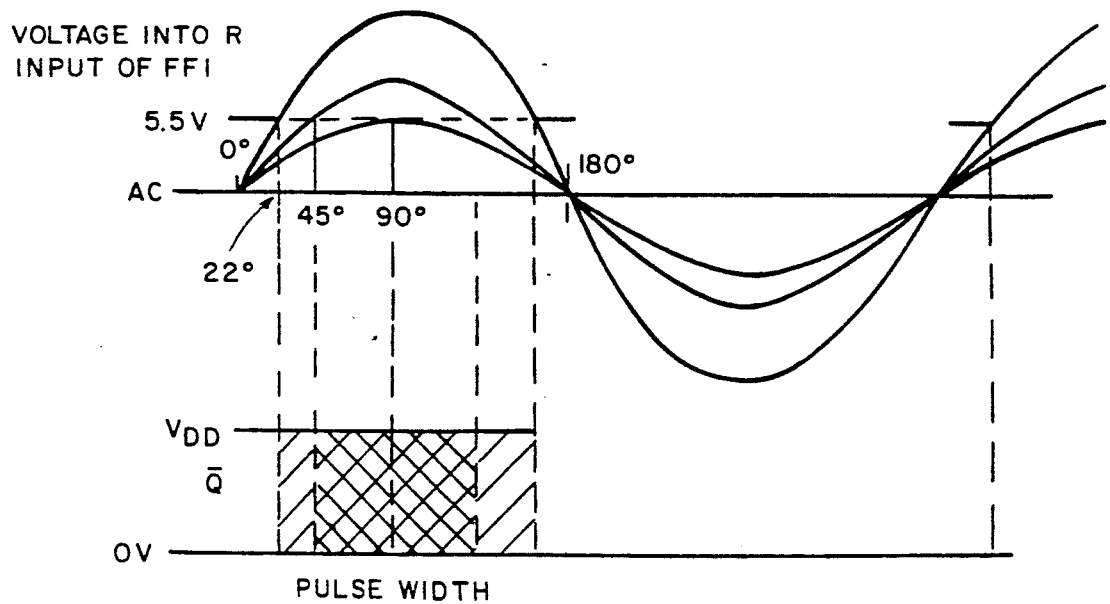
FIG. 1 is a waveform diagram showing the AC input voltage wave of the first embodiment plotted against the Q/output of the first flip-flop in the first embodiment.
Figure 2:
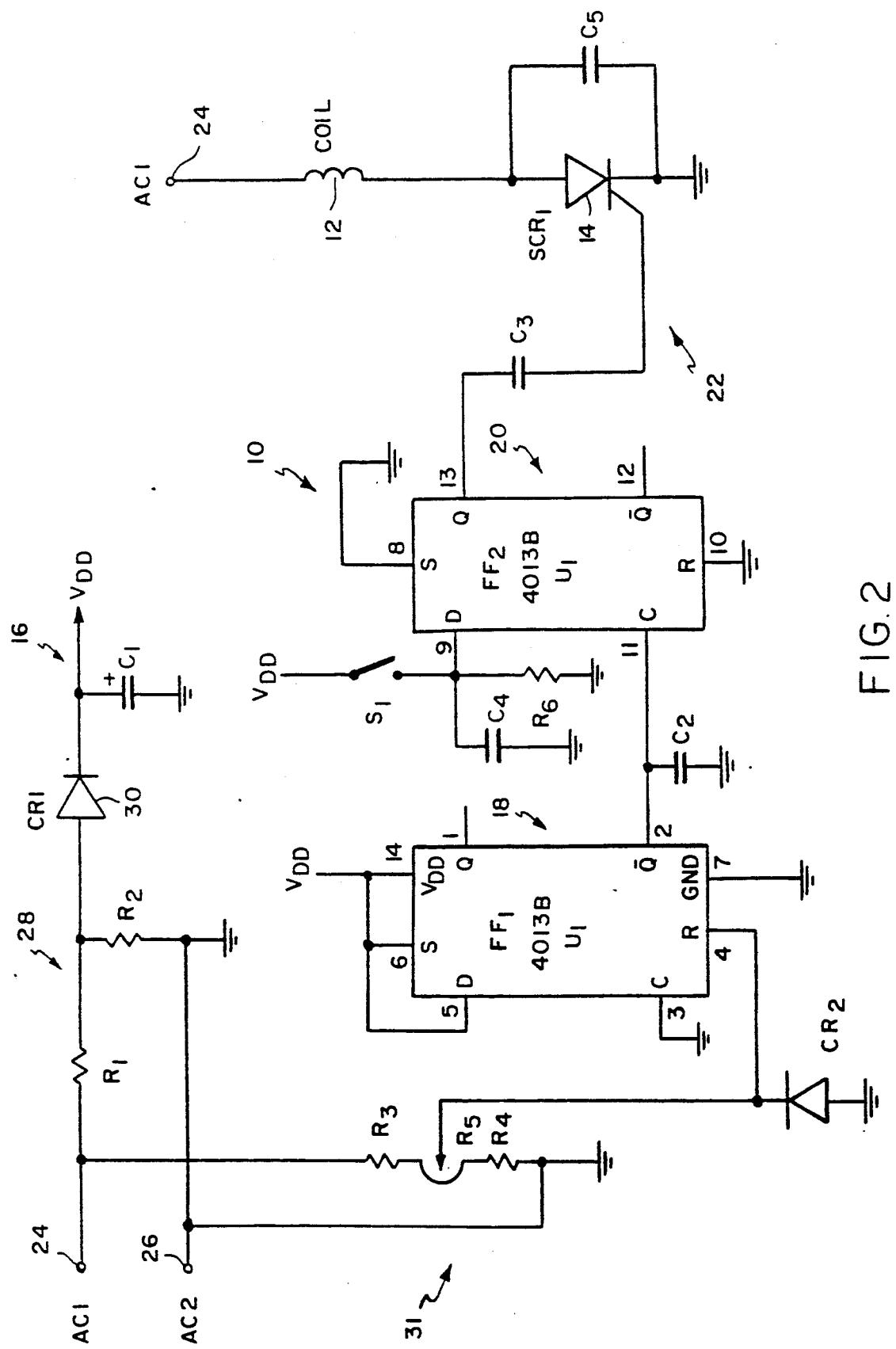
FIG. 2 is a schematic diagram of the variable power driver circuit of the first embodiment.

Referring now to FIGS. 1 and 2 and particularly to the schematic of FIG. 2, there is shown a variable power driver circuit of the invention indicated generally by the reference numeral 10 for providing a variable power drive signal to a load circuit 12, such as the coil of an electric stapler.

The solenoid driver circuit 10 is capable of triggering an SCR 14 for a single half-cycle of the AC line. The circuit comprises a power supply section 16, a sine wave shaper 18, a clocked flip-flop 20, an SCR coupling 22 and the SCR 14.

The power supply section 16 is used to generate $V_{DD}$ (drain voltage) for a dual D flip-flop, $FF_1$ and $FF_2$, such as a CMOS 4013B. A source of input AC voltage (not shown) is applied to driver circuit input terminals 24 and 26. The power supply comprises a voltage divider 28 and a half-wave rectifier 30. The voltage divider 28 uses resistors $R_1$ and $R_2$. The rectifier circuit with filter capacitor $C_1$ generates an output of 12 volts DC with a ripple of $+/-2$ volts at nominal AC line input (115 volts).

The sine wave shaper 18 is used to decrease the rise and fall time of the AC input waveform in order to insure a fast transition through the switching region of the clocked flip-flop. The first stage ($FF_1$) of the dual flip-flop is used for this purpose. The AC input voltage, which is passed through a variable voltage divider 31, is used as the input to the wave shaper 18. The voltage divider 31 comprises fixed resistors R3 and R4 and a potentiometer R5. Diode $CR_2$ is used to prevent the AC voltage from going negative and causing damage to the flip-flop $FF_1$ while resistor R4 prevents the voltage from going below the switching point of the flip-flop $FF_1$ and causing a "no fire" of the circuit.

The flip-flop $FF_1$ has its clock input disabled and is used as an R-S flip-flop. Since the S input is connected to $V_{DD}$, the output Q/ will be low as R is kept low. When R is forced high (during the positive portion of the AC input), the Q/output will be forced high (the Q output will also be high since the S input is held high). The output Q/ will therefore follow the AC input except for the positive edge variable delay described below.

The R input of the flip-flop will be considered high if its voltage is 70% of $V_{DD}$ in the worse case, typically if it is 55% of $V_{DD}$. For 115 VAC input, the peak value at the output of the divider is 14 volts and $V_{DD}$ is 10 volts just prior to the positive peak of the AC input. Thus, when the R input to the flip-flop is 5.5 volts (7 volts worse case), the Q/ output will go high. This corresponds to 0.39 (0.5 worse case) of the peak voltage of 14. Thus, the flip-flop will switch at 22 (30 worse case) degrees into the positive cycle (see FIG. 1). Since the triggering of the SCR 14, as described below, depends upon this timing, the solenoid coil 12 will fire at 22 to 30 degrees into the positive cycle.

Given that the flip-flop $FF_1$ requires an R input of 5.5 volts (7 volts worse case) to switch Q/high, the position in the AC cycle where the R input attains the required voltage can be varied by controlling the amplitude of the sine wave input signal to the flip-flop. This is accomplished by varying the setting of the potentiometer $R_5$ in the voltage divider circuit 30. FIG. 1 illustrates the effect of varying the input sine wave amplitude on the output of Q/.

The phase angle position in the sine wave at which the required R input voltage occurs can be varied from 22 degrees (30 degrees worse case) to 90 degrees by adjusting the voltage divider potentiometer $R_5$. Since the timing of Q/ going high controls the firing of SCR 14, the firing of SCR 14 can be varied from 22 degrees to 90 degrees into the positive half cycle of the AC current. Given practical considerations, the firing point preferably should not exceed 80 degrees.

It will be appreciated that the further into the positive half cycle that the SCR is fired, the less energy is delivered to the solenoid coil 12, thus reducing its power. At 90 degrees, the total energy contained in the sine wave is reduced by 50%.

Given the slow rise and fall times of the signal at the Reset input, the Q/ output waveform may exhibit double switching between set and reset (a "glitch") near the time when the flip-flop sets or resets. Capacitor $C_2$ prevents such "glitches".

The second flip-flop ($FF_2$) is used as a clocked flip-flop in order to set at the beginning (or within 30° of the beginning) of the positive cycle of the AC voltage. $FF_2$, however, will not change state unless switch $S_1$, which may be a single pole single throw switch, is closed. With $S_1$ open, the D input of $FF_2$ remains low and the flip-flop will remain reset.

When $S_1$ is closed, the D input of $FF_2$ will go high and the next positive edge of the timing signal from $FF_1$ will set $FF_2$. When $FF_2$ is set, the Q output will switch from low to high thereby generating a positive pulse through $C_3$ and triggering the SCR.

The flip-flop will trigger if the D input happens to be high during the positive transition of the waveform into the Clock input. If the next positive transition of this waveform occurs when the D input is low, the flip-flop will reset. The resetting of $FF_2$ is undesirable because eventually the D input will go high again and there will be two positive transitions into $C_3$ thus causing the SCR to fire on two successive positive cycles of the AC input. In order for this to occur, the contact bounce on the switch must last for at least the duration of one cycle of the AC input. The same analysis applies to the opening of the switch $S_1$ in which case the D input goes from high to low. The circuit thus provides inherent switch bounce rejection equal to one cycle of the AC input (16.6 milliseconds for 60 Hz and 20 milliseconds for 50 Hz).

Capacitor $C_4$ reduces high frequency noise pick-up in the leads to the switch. This noise can cause firing of the circuit when the AC power is applied to the circuit or when AC line transients are present.

The purpose of capacitor $C_5$ is to prevent firing of the SCR due to AC line noise. This noise, which can consist of spikes of voltage of up to 2000 volts in amplitude and rise time of several microseconds, can exceed the dv/dt noise rejection of the SCR. $C_5$ reduces the amplitude of dv/dt across the SCR.

By way of illustration only, the following parts list can be employed in constructing the driver circuit shown in FIG. 2.

| SOLENOID DRIVE CIRCUIT PARTS LIST | |
| --- | --- |
| $R_1$ | Resistor, carbon, 33K ohms, ¼ watt, 5% (115 VOLTS) Resistor, carbon 68K ohms, 1 watt, 5% (230 volts) |
| $R_2$ | Resistor, carbon, 3.9K ohms, ¼ watt, 5% |
| $R_3$ | Resistor, carbon, 33K ohms, ¼ watt, 5% |
| $R_4$ | Resistor, carbon, 1.3K ohms, ¼ watt, 5% |
| $R_5$ | Potentiometer, 2.5K ohms |
| $R_6$ | Resistor, carbon, 100K ohms, ¼ watt, 5% |
| $C_1$ | Capacitor aluminum electrolytic, 2.2 Mfd., ±20%, 25 volts |
| $C_2, C_4, C_5$ | Capacitor, ceramic disc, .0047 Mfd., ±20%, 500 volts |
| $C_3$ | Capacitor, ceramic disc, .047 Mfd., ±20%, 25 volts |
| $CR_1$ | Diode, 1N4148 |
| $CR_2$ | Diode, 1N4148 |
| $U_1$ | D-Type Dual Flip-Flop, CMOS, 4013B: Fairchild F4013BC Motorola MC1403BCP National CD4013BC Panasonic MN4013B RCA 4013B Signetics HEF4013BP SSS SCL4013BE |
| $SCR_1$ | Silicon Controlled Rectifier: RCA S2800D,E,M (400, 500, 600 VDRM) TECCOR 6010L |

EMBODIMENT 2

Figure 3:
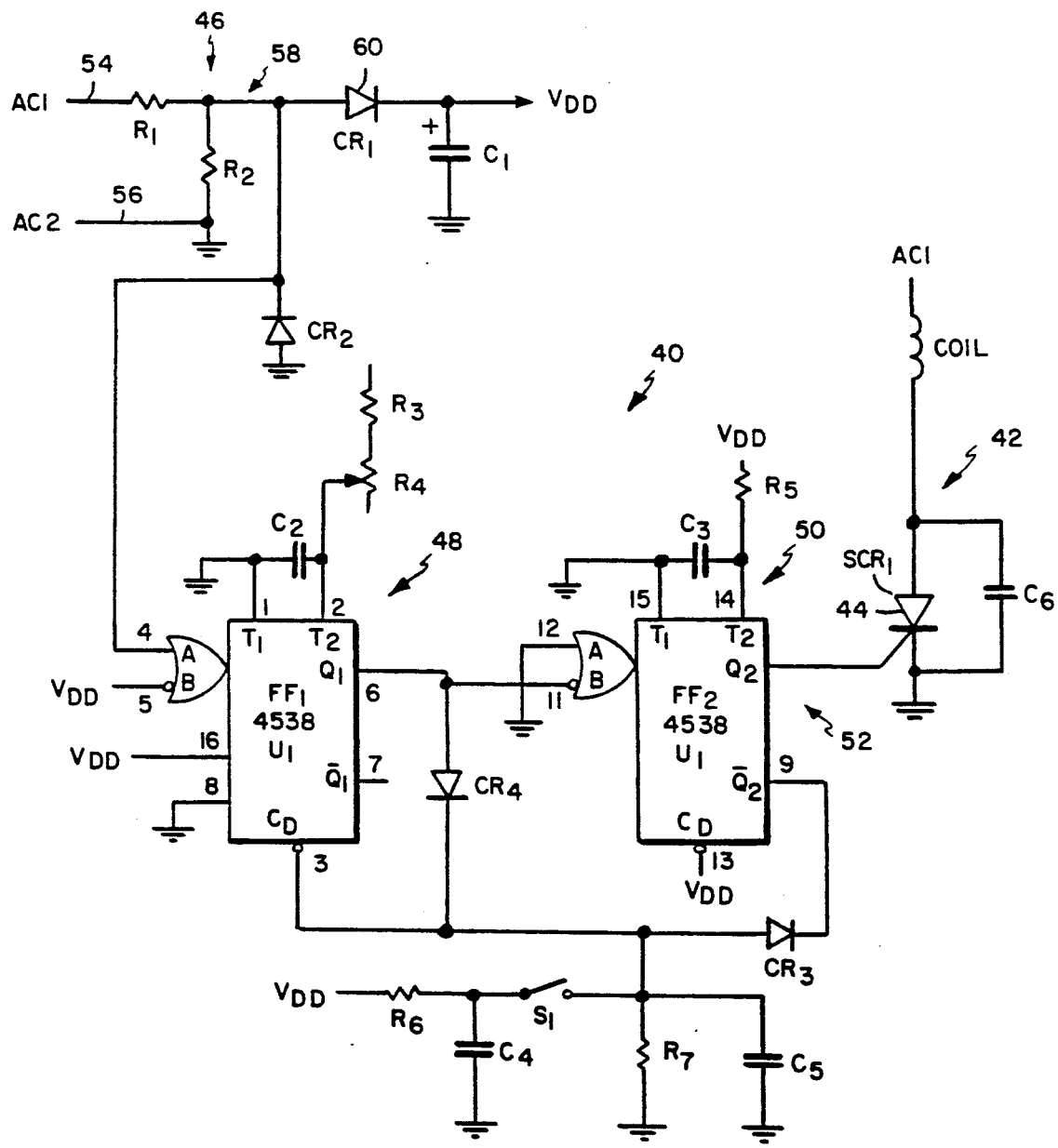
FIG. 3 is a schematic diagram of the variable power driver circuit of the second embodiment.
Figure 5:
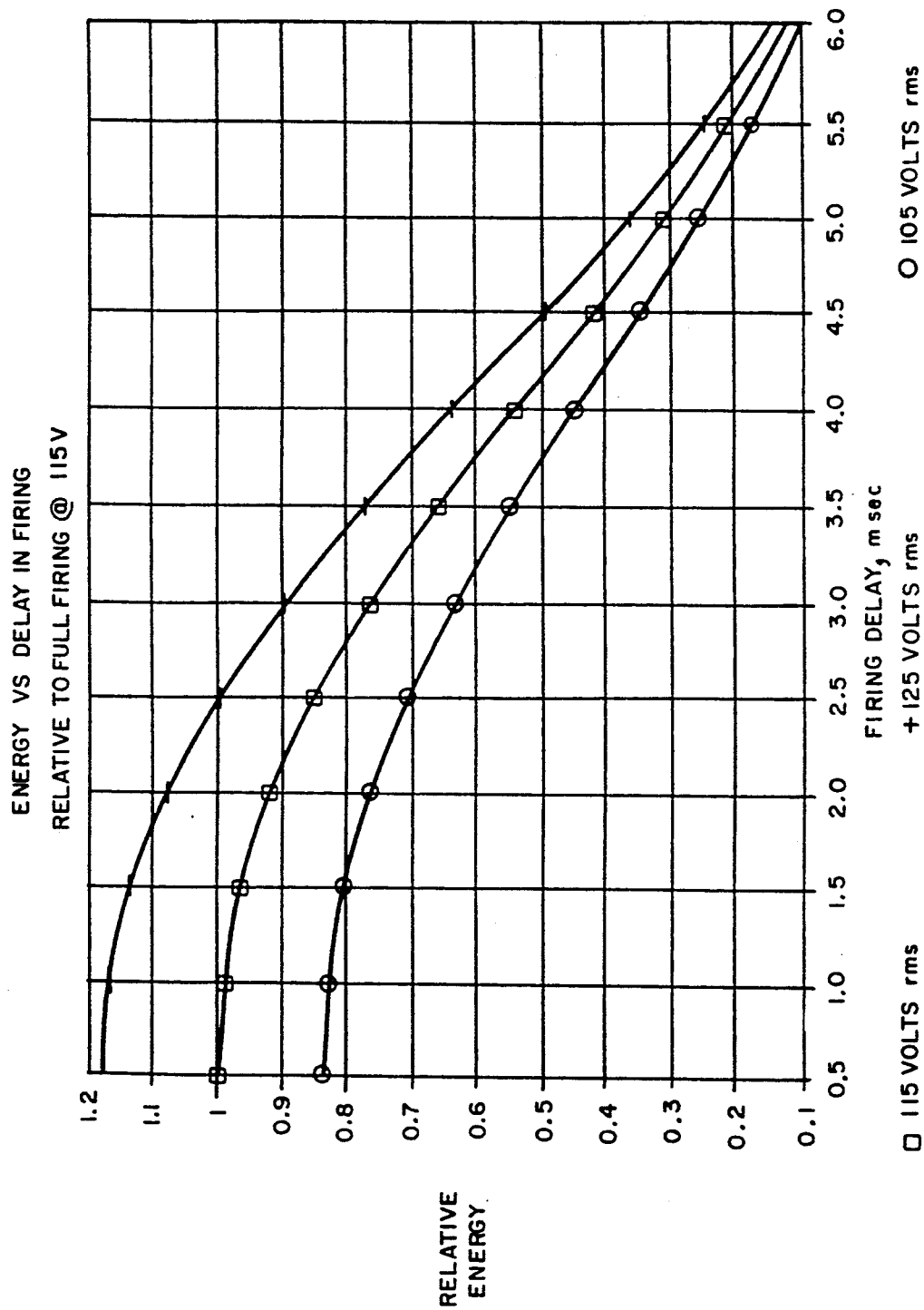
FIG. 5 illustrates the relative energy applied to the coil in the second by a half pulse of a sine wave, as a function of the delay in turn on and as a function of line voltage.

Referring to FIGS. 3 through 5, particularly to the schematic of FIG. 3, there is shown an alternative variable power driver circuit of the present invention indicated generally by the reference numeral 40 for providing a variable power drive signal to a load circuit 42, such as the coil of an electric stapler.

The driver circuit 40 is capable of triggering an SCR 44 for a single half cycle of the AC line. The circuit comprises a power supply section 46, a variable delay 48 (one-shot), a pulse generator 50 (one-shot), an SCR coupling and the SCR 44.

The power supply section 46 is used to generate a $V_{DD}$ (drain voltage) for the one-shots 48 and 50, such as U1 4538. A source of input AC voltage (not shown) is applied to driver circuit input terminals 54 and 56. The power supply section comprises a voltage divider 58 and a half-way rectifier 60. The voltage divider 58 uses resistors R1 and R2. The rectifier circuit with a filter capacitor $C_1$ generates an output of approximately 12 volts DC.

The AC input waveform, FIG. 4a, is applied to terminals 54 and 56 and is passed through the voltage divider 58, then the negative excursions are clamped to ground by a diode $CR_2$. The resulting waveform, FIG. 4b, is applied to the input, pin 4, of one-shot 48.

The SCR in the driver circuit will not trigger when one-shot 48 is disabled by holding its (pin 3) low with resistor R7.

When switch S1 is closed, one-shot 48 will be triggered at the next positive cycle of the AC input as shown in FIG. 4c. The voltage across capacitor $C_4$ being applied to the clear input (pin 3) of one-shot 48 is maintained at a logic high level (0.7 $V_{DD}$) for at least one full cycle of the AC input, by using resistors $R_6$ and $R_7$ to control the time constant of the decay.

When one-shot 48 is triggered, its output $Q_1$ immediately goes high. Switch bounce can generate a momentary low at the clear input (pin 3) of one-shot 48 which would reset it part-way through its ON time. This is prevented by using the output of $Q_1$ and diode $CR_4$ to force the clear input (pin 3) all the way to $V_{DD}$ after triggering has occurred.

One-shot 48 controls the degree of delay in the drive signal. The width of pulse output $Q_1$, as shown in FIG. 4d, is dependent on $C_2$ and the setting of variable resistor $R_4$. The delay can be varied between six milliseconds, when $R_4$ is at its maximum resistance and 250 microseconds, when $R_4$ is at zero resistance plus $R_3$ which has a value of 5% of the resistance of $R_4$. One-shot 50 is triggered at the trailing edge of the delay pulse from $Q_1$. When one-shot 50 is triggered, the $Q_2$ output will emit a pulse as shown in FIG. 4e, and fire the SCR 44. Thus, the SCR 44 is fired after a delay from the start of the positive cycle of the AC, only allowing part of the AC cycle to travel through the load, as shown in FIG. 4f.

If the voltage at the clear input (pin 3) of one-shot 48 were allowed to decay by discharging $C_4$ through $R_7$, this level would remain at a logic high for perhaps two or more cycles of the AC input. This would cause a multiple firing of the one-shots 48 and 50 and the SCR 44. Multiple firings are prevented in this embodiment by using the output of $Q_2$/of the one-shot 50 and the diode $CR_3$ to cause the rapid discharge of $C_4$ and $C_5$ when one-shot 50 is triggered.

After one-shot 50 has been triggered, the clear input (pin 3) of one-shot 48 is held at a logic low (25% of $V_{DD}$) by voltage divider $R_6$ and $R_7$ until $S_1$ is released and $C_4$ is allowed to recharge. When $CR_3$ conducts due to one-shot 50 triggering, the output of one-shot 48, $Q_1$, is low and $CR_4$ is no longer forcing the clear input (pin 3) high.

When $S_1$ is released, sufficient time should be allotted to allow $C_4$ to recharge, usually around 0.2 seconds. If sufficient time is not allowed, the circuit may not trigger.

Caacitor $C_5$ is used to ensure that pin 3 is held low for a few hundred microseconds when power is first applied to the circuit. This allows for settling of the transients within the circuit and prevents firing the solenoid during power turn on. Capacitor $C_5$ is much smaller than capacitor $C_4$ so it does not have a material affect on the discharge of $C_4$ when the switch S1 is closed.

Although the delay produced by this embodiment of the driver circuit is independent of line voltage, the energy supplied to the coil is proportional to the square of the line voltage.

FIG. 5 shows the relative energy applied to the coil, or load, by a half-pulse of a sine wave, as a function of the delay in turn on and as a function of line voltage.

By way of illustration only, the following parts list can be employed in constructing the driver circuit as shown in FIG. 3.

| DRIVE CIRCUIT PARTS LIST | |
|---|---|
| $R_1$ | Resistor, carbon, 33K ohms, ¼ watt |
| $R_2$ | Resistor, carbon, 3.9K ohms |
| $R_3$ | Resistor, carbon, 4.7K ohms |
| $R_4$ | Potentiometer, 100K ohms |
| $R_5$ | Resistor, carbon, 100K ohms |
| $R_6$ | Resistor, carbon 1M ohms |
| $R_7$ | Resistor, carbon 330K ohms |
| $C_1$ | Capacitor, aluminum electrolytic, 2.2 Mfd., ±20%, 25 volts |
| $C_2$ | .05 Mfd. |
| $C_3$ | .001 Mfd. |
| $C_4$ | .1 Mfd. |
| $C_5$ | .001 Mfd. |
| $C_6$ | .005 Mfd., 500 volts |
| $CR_1, CR_2, CR_3, CR_4$ | diode, 1N4148 |
| $U_1$ | Motorola MC 14538BCP GE CP 4538 BE |
| $SCR_1$ | Silicon Controlled Rectifier: RCA S2800D,E,M (400, 500, 600 $V_{DRM}$) TECCOR 6010L |

Although described in reference to AC line input of 115 volts, the values of $R_1$ and $R_2$, FIGS. 2 and 3, can be changed to accommodate 230 volts.

Having described in detail two preferred embodiments of our invention, it will now be apparent to those skilled in the art that numerous modifications can be made therein without departing from the scope of the invention as defined in the following claims.

What we now claim is:

1. A driver circuit which is responsive to an input AC line voltage for providing a variable power drive signal to a load circuit, said driver circuit comprising:
   a) means for receiving the input AC voltage;
   b) switch actuated timing circuit means for producing a variable timing delay signal that is synchronized to the AC voltage cycle and that can be started at the beginning of the positive half-cycle of the AC voltage cycle;
   c) control signal generating means responsive to said timing delay signal for generating a control signal for a selected period of time within one cycle of the AC input voltage, said selected time period occurring only during the time that the input AC voltage is in the positive portion of its cycle;
   d) first switch means for activating said timing circuit means to produce said timing signal;
   e) means for applying said timing delay signal to said control signal generating means; and
   f) firing means responsive to said control signal for providing a drive signal to the load circuit during the time period that the control signal is applied to the firing means.

2. The driver circuit of claim 1 wherein said control signal generating means is switch actuated in response to said timing signal for generating the control signal; and which comprises: a second switch means for actuating said control signal.

3. The driver circuit of claim 1 wherein said timing circuit means and said control signal generation means comprise a single integrated circuit chip.

4. The driver circuit of claim 3 wherein said single integrated circuit chip is a flip-flop.

5. The driver circuit of claim 2 wherein siad first switch means comprises a single pole single throw switch.

6. The driver circuit of claims 1 or 5 wherein only one control signal is produced during a full cycle of the AC voltage even though switch bounce occurs during a portion of the AC voltage cycle.

7. The driver circuit of claim 1 which includes sine wave shaper means for producing a positive edge variably delayed square wave timing signal and wherein the variably delayed positive edge of the square wave timing signal is delayed within the range of 22 degrees to 80 degrees from the positive going zero crossing of the input AC voltage and wherein the control signal generating means comprises a switch actuated continually clocked flip-flop.

8. The driver circuit of claim 7 wherein said clocked flip-flop is a D-type flip-flop and wherein actuation of said switch means applies drain voltage to said flip-flop.

9. The driver circuit of claim 1, wherein the variably delayed positive edge of the square wave timing signal is delayed within the range of 22 degrees to 80 degrees from the positive going zero crossing of the input AC voltage.

10. The driver circuit of claim 1 wherein said timing circuit means and said control signal generation means comprise two one-shots.

11. The driver circuit of claim 10 wherein only one control signal is produced during a full cycle of the AC voltage even though switch bounce occurs during a portion of the AC cycle.

12. The driver circuit of claim 10 wherein said first switch means comprises a single pole signal throw switch.

13. The driver circuit of claim 10 wherein said timing delay signal is a positive edge square wave whose width is variable.

14. The driver circuit of claim 13 wherein said width of said timing delay signal depends on a capacitor and potentiometer in conjunction with one of said one-shots where said delay signal width increases as said potentiometer resistance increases.

15. The driver circuit of claim 13 wherein said control signal generating means is responsive to the trailing edge of said timing delay signal.

16. The driver circuit of claim 10 wherein said selected period of time for said control signal is approximately 100 microseconds.

* * * * *